(12) United States Patent
Yoo et al.

(10) Patent No.: US 9,272,300 B2
(45) Date of Patent: Mar. 1, 2016

(54) METHOD AND APPARATUS FOR MANUFACTURING WHITE LIGHT-EMITTING DEVICE

(71) Applicant: SAMSUNG ELECTRONICS CO., LTD., Suwon-si, Gyeonggi-do (KR)

(72) Inventors: Cheol-Jun Yoo, Cheonan-Si (KR); Seong-Jae Hong, Hwaseong-Si (KR); Tsuyoshi Tsutsui, Suwon-Si (KR); Shin-Kun Kim, Ansan-Si (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

(21) Appl. No.: 14/451,217

(22) Filed: Aug. 4, 2014

(65) Prior Publication Data

US 2014/0338593 A1    Nov. 20, 2014

Related U.S. Application Data

(62) Division of application No. 13/338,678, filed on Dec. 28, 2011, now Pat. No. 8,796,050.

(30) Foreign Application Priority Data

Jan. 17, 2011    (KR) ........................ 10-2011-0004530

(51) Int. Cl.
| | |
|---|---|
| *B05C 11/00* | (2006.01) |
| *B05C 1/02* | (2006.01) |
| *H01L 21/67* | (2006.01) |
| *H01L 21/683* | (2006.01) |

(Continued)

(52) U.S. Cl.
CPC ............ *B05C 1/027* (2013.01); *H01L 21/6715* (2013.01); *H01L 21/6838* (2013.01); *H01L 33/0079* (2013.01); *H01L 33/50* (2013.01); *H01L 2933/0041* (2013.01)

(58) Field of Classification Search
USPC .......... 118/504, 505, 500, 721, 301; 438/460, 438/462, 700, 745, 26, 28, 34, 465; 257/E33.059
See application file for complete search history.

(56) References Cited

U.S. PATENT DOCUMENTS

| | | | |
|---|---|---|---|
| 3,846 | A | 2/1870 | Van Brunt |
| 681,853 | A | 9/1901 | Williams |

(Continued)

FOREIGN PATENT DOCUMENTS

| | | |
|---|---|---|
| KR | 10-2009-0102121 A | 9/2009 |
| KR | 10-2009-0122210 A | 11/2009 |

OTHER PUBLICATIONS

U.S. Non-Final Office Action issued in U.S. Appl. No. 13/338,678 dated May 28, 2013.

(Continued)

*Primary Examiner* — Yewebdar Tadesse
(74) *Attorney, Agent, or Firm* — McDermott Will & Emery LLP (57) ABSTRACT

Methods and apparatus for manufacturing a semiconductor light-emitting device that emits white light by forming a phosphor layer on an emission surface of the semiconductor light-emitting device at a wafer-level. The method includes: forming a plurality of light-emitting devices on a wafer; thinning the wafer, on which the plurality of light-emitting devices are formed; disposing the thinned wafer on a carrier film; and forming a phosphor layer on an emission surface of the plurality of light-emitting devices on the wafer.

7 Claims, 7 Drawing Sheets

(51) Int. Cl.
*H01L 33/00* (2010.01)
*H01L 33/50* (2010.01)

(56) References Cited

U.S. PATENT DOCUMENTS

| | | | |
|---|---|---|---|
| 708,442 A | 9/1902 | Van Brunt | |
| 5,288,663 A | 2/1994 | Ueki | |
| 5,888,883 A | 3/1999 | Sasaki et al. | |
| 6,297,131 B1 | 10/2001 | Yamada et al. | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,049,159 B2 | 5/2006 | Lowery | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,482,690 B1 * | 1/2009 | Fan et al. | 257/724 |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,930,974 B2 | 4/2011 | Nakatani et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2008/0173884 A1 | 7/2008 | Chitnis et al. | |
| 2008/0290351 A1 | 11/2008 | Ajiki et al. | |
| 2009/0134420 A1 | 5/2009 | Nagai | |
| 2009/0179207 A1 | 7/2009 | Chitnis et al. | |
| 2010/0078657 A1 | 4/2010 | Nagai | |
| 2010/0120230 A1 * | 5/2010 | Grivna et al. | 438/464 |
| 2011/0266560 A1 | 11/2011 | Yao et al. | |

OTHER PUBLICATIONS

U.S. Non-Final Office Action issued in U.S. Appl. No. 13/338,678 dated Dec. 13, 2013.

U.S. Notice of Allowance issued in U.S. Appl. No. 13/338,678 dated Mar. 31, 2014.

* cited by examiner

METHOD AND APPARATUS FOR MANUFACTURING WHITE LIGHT-EMITTING DEVICE

CROSS-REFERENCE TO RELATED APPLICATION

This application is a Divisional of U.S. patent application Ser. No. 13/338,678, filed on Dec. 28, 2011, which claims the priority of Korean Patent Application No. 10-2011-0004530, filed on Jan. 17, 2011, the disclosures of which are incorporated herein in its entirety by reference.

BACKGROUND

1. Field

The present disclosure relates to methods and apparatuses for manufacturing a white light-emitting device, and more particularly, to methods and apparatus for manufacturing a semiconductor light-emitting device that emits white light by forming a phosphor layer on an emission surface of the semiconductor light-emitting device at a wafer-level.

2. Description of the Related Art

Light emitting diodes (LEDs) are semiconductor light-emitting devices that change an electric signal into light by using the characteristics of a compound semiconductor. Semiconductor light-emitting devices such as LEDs have a longer lifetime than other general luminous bodies, are driven at a low voltage, and have low power consumption. Also, the semiconductor light-emitting devices such as LEDs have excellent response speeds and impact resistance and are small and light in weight. Such a semiconductor light-emitting device may emit lights of different wavelengths according to the type and composition of a semiconductor used and if desired, may form lights of different wavelengths.

Currently, lighting lamps using a white light-emitting device having high brightness have been replaced with general fluorescent lamps or incandescent lamps. The white light-emitting device may be manufactured by forming a red, green, or yellow phosphor layer on a emission surface of the light emitting device that emits blue or UV light. The phosphor layer is generally formed in the light emitting device during the separation of the light emitting device from a wafer and packaging. For example, the phosphor layer may be formed by coating phosphor paste on the light emitting device and hardening the phosphor paste after attaching the light emitting device on a wiring substrate such as a lead frame or a printed circuit board (PCB). However, when the phosphor layer is formed during packaging, optical characteristics of each completed light-emitting device package may vary by dispersion generated while forming the phosphor layer in each packaging process. Accordingly, it may be hard to secure uniform quality of a light-emitting device package.

SUMMARY

Provided are methods and apparatuses for manufacturing a semiconductor light-emitting device that emits white light by forming a phosphor layer on an emission surface of the semiconductor light-emitting device at a wafer-level.

Additional aspects will be set forth in part in the description which follows and, in part, will be apparent from the description, or may be learned by practice of the presented embodiments.

According to an aspect of the present invention, a method of manufacturing a light-emitting device includes: forming a plurality of light emitting devices on a wafer; thinning the wafer, on which the plurality of light-emitting devices are formed; disposing the thinned wafer on a carrier film; and forming a phosphor layer on an emission surface of the plurality of light-emitting devices on the wafer.

The forming of the phosphor layer may include: disposing the carrier film, on which the wafer is disposed, on a vacuum table; closely adhering and fixing the carrier film on the vacuum table by vacuum suction pressure; coating a phosphor paste on the wafer; and forming the phosphor layer by hardening the phosphor paste.

The vacuum table may have a stepped structure, in which a center portion thereof protrudes to be higher than peripheral portions thereof.

A carrier frame may be disposed along a circumference of the carrier film, and a diameter of the protruding center portion of the vacuum table may be smaller than an inner diameter of the carrier frame.

The carrier frame formed along the circumference of the carrier film may be closely adhered and fixed to the peripheral portions of the vacuum table, and the wafer disposed on the carrier film may be closely adhered and fixed to the center portion of the vacuum table.

A height of the center portion of the vacuum table may be higher than a height of the carrier frame.

The coating of the phosphor paste may include: disposing a printing mask on the wafer; providing the phosphor paste on the printing mask; and pressurizing the phosphor paste by using a squeegee and uniformly coating the phosphor paste on the wafer.

The printing mask may include a mask frame formed around the circumference of the printing mask to support the printing mask, a first masking member formed to cover a region other than the wafer, and a printing region corresponding to the wafer.

The printing region may include a plurality of openings having the same pattern as that of the plurality of light-emitting devices formed on the wafer, a second masking member formed to correspond to the scribe line formed between the light-emitting devices, and third masking members formed to correspond to electrode pads formed on the light-emitting devices.

The printing region may include a plurality of openings having the same pattern as that of the plurality of light-emitting devices formed on the wafer and a second masking member formed to correspond to the scribe line formed between the light-emitting devices, the second masking member being extended to regions corresponding to the electrode pads formed on the light-emitting devices.

The printing region may include one opening entirely formed in the printing region and third masking members formed to correspond to electrode pads formed on the light-emitting devices.

The method may further include: after the phosphor layer is formed, removing the wafer from the carrier film; and dicing the plurality of light-emitting devices formed on the wafer.

The carrier film may include a base film and a cohesive layer formed on the base film.

The cohesive layer may include a photosensitive adhesive (PSA) that may be hardened by UV light and the base film has permeability for UV light.

The removing of the wafer from the carrier film may include hardening the cohesive layer by irradiating UV light from the lower side of the carrier film and removing the wafer from the hardened cohesive layer.

According to another aspect of the present invention, a method of manufacturing a light-emitting device includes:

forming a plurality of light-emitting devices on a wafer; thinning the wafer, on which the plurality of light-emitting devices are formed; separating the plurality of light-emitting devices formed on the wafer through dicing; arranging the separated light-emitting devices on a carrier film; and forming a phosphor layer on an emission surface of the plurality of light-emitting devices arranged on the carrier film.

The forming of the phosphor layer may include: disposing the carrier film, on which the light-emitting devices are arranged, on a vacuum table; closely adhering and fixing the carrier film on the vacuum table by vacuum suction pressure; coating a phosphor paste on the light-emitting devices; and forming the phosphor layer by hardening the phosphor paste.

According to another aspect of the present invention, an apparatus for manufacturing a light-emitting device includes: a vacuum table comprising a center portion protruding upward and peripheral portions that are stepped to be lower than the center portion; a carrier film disposed on the vacuum table for attaching the wafer, on which a plurality of light-emitting devices are formed, on the carrier film; and a printing mask for uniformly coating a phosphor paste on the wafer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Hereinafter, a method and apparatus for manufacturing a white light-emitting device according to one or more embodiment of the present invention will be described in detail with reference to the accompanying drawings. In the drawings, like reference numerals denote like portions and sizes of each element are exaggerated for clarity.

Figure 1:
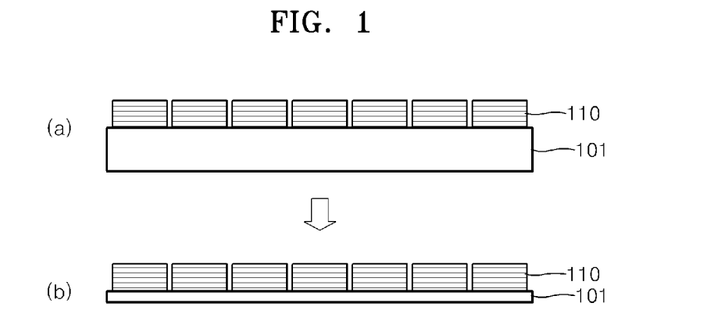
FIGS. 1A and 1B are cross-sectional views schematically illustrating the manufacturing of a semiconductor light-emitting device on a wafer.

In the method of manufacturing a white light-emitting device, according to the current embodiment of the present invention, a plurality of semiconductor light-emitting devices 110 are formed on a wafer 101, as illustrated in FIG. 1A. The wafer 101 may be formed of, for example, sapphire, GaN, or silicon. The plurality of semiconductor light-emitting devices 110 may be formed on the wafer 10 by using a generally known method. Although not illustrated in FIG. 1A, a buffer layer, an n-type nitride semiconductor layer, an active layer as a multiple quantum well, and a p-type nitride semiconductor layer are formed on the wafer 101 and then the p-type nitride semiconductor layer is partially mesa etched so as to form a p-type electrode and an n-type electrode. Various methods of forming the semiconductor light-emitting devices 110 on the wafer 101 are well known, and the present invention is not particularly restricted to any particular method.

Figure 2:
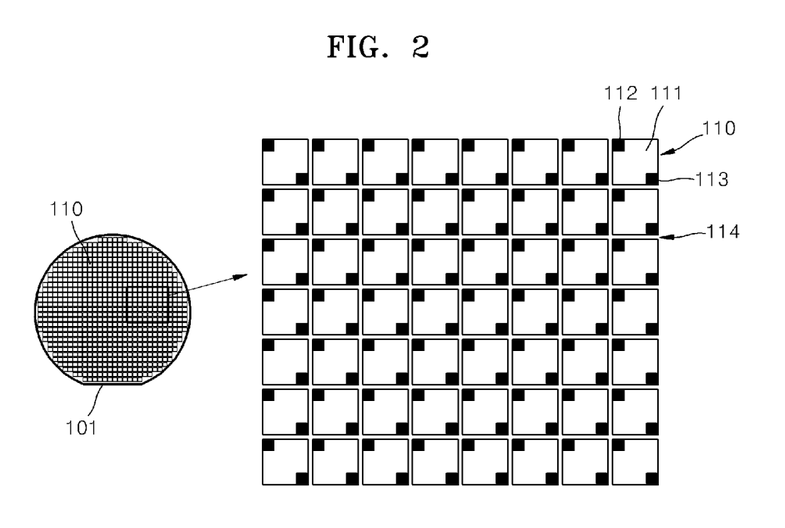
FIG. 2 illustrates patterns of a plurality of semiconductor light-emitting devices formed on a wafer.

FIG. 2 illustrates patterns of the plurality of semiconductor light-emitting devices 110 formed on the wafer 101. At the left side of FIG. 2, the patterns of the plurality of semiconductor light-emitting devices 110 formed on the wafer 101 are illustrated. In an enlarged view illustrated at the right side of FIG. 2, the plurality of semiconductor light-emitting devices 110 may be generally formed and arranged on the wafer 101 in a square lattice form. An emission surface 111 for emitting light and at least one electrode pad 112 and 113 for electric connection may be formed on an upper surface of each semiconductor light-emitting device 110. In FIG. 2, two electrode pads 112 and 113, that is, an N-type electrode pad 112 and a P-type electrode pad 113, are formed on the upper surface of the semiconductor light-emitting device 110. For example, the two electrode pads 112 and 113 may be respectively disposed at corners that face each other in a diagonal direction on the semiconductor light-emitting device 110. The semiconductor light-emitting devices 110 are separated from other adjacent semiconductor light-emitting devices 110 through a scribe line 114. In a subsequent dicing process for separating each semiconductor light-emitting device 110, the wafer 101 may be cut along the scribe line 114.

When forming of the plurality of semiconductor light-emitting devices 110 on the wafer 101 is completed, the wafer 101 is thinned, as illustrated in FIG. 1B. For example, the wafer 101 may be ground to have a thickness of about 10 to about 200 μm. If a phosphor layer is first formed on the semiconductor light-emitting devices 110 and then the wafer 101 is thinned, the wafer 101 should be turned upside down so that a bottom surface of the wafer faces upward and thus the phosphor layer is attached on a substrate for grinding. However, in this case, the phosphor layer on the semiconductor light-emitting devices 110 may be damaged during a thinning process and it is hard to attach the phosphor layer on the substrate for grinding.

Figure 3:
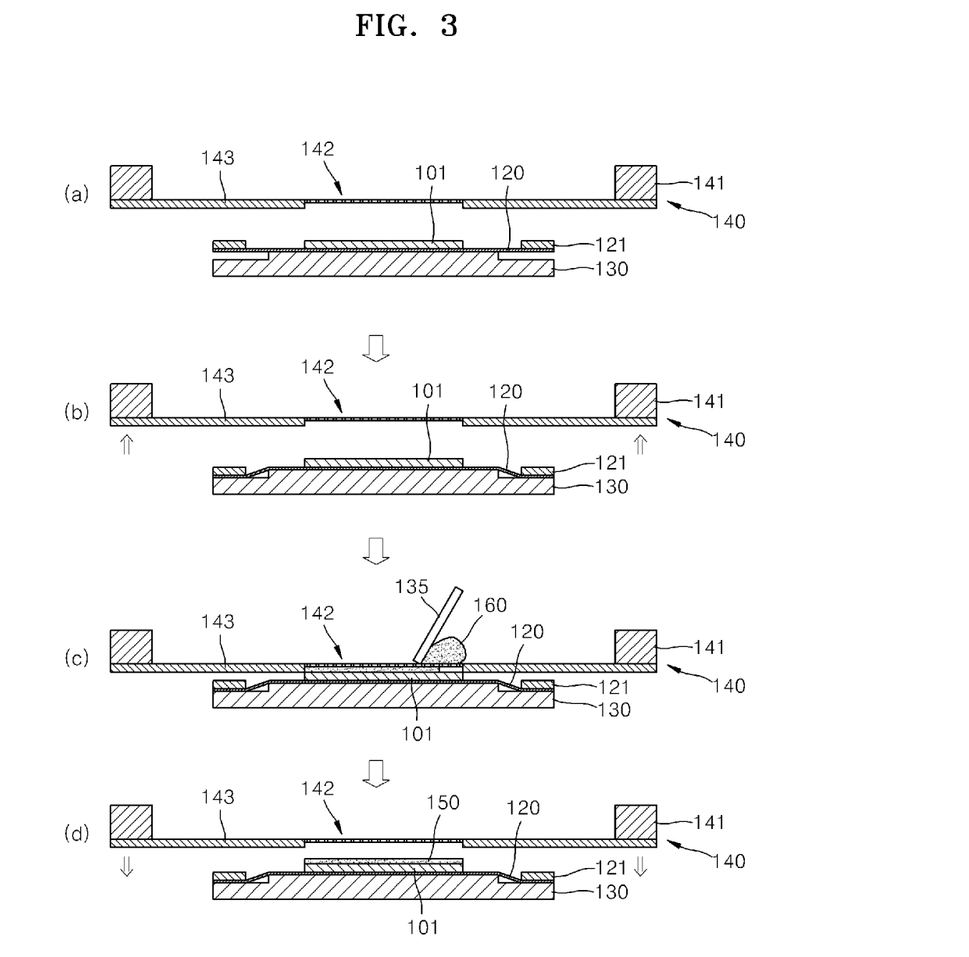
FIGS. 3A through 3D are cross-sectional views schematically illustrating forming of a phosphor layer on an emission surface of a semiconductor light-emitting device at a wafer-level.

After thinning the wafer 101, the phosphor layer is formed on an emission surface of the semiconductor light-emitting devices 110 at a wafer-level by using, for example, screen printing. FIGS. 3A through 3D are cross-sectional views schematically illustrating forming of the phosphor layer on the emission surface of the semiconductor light-emitting devices 110 at a wafer-level. In FIG. 3, for convenience of description, the semiconductor light-emitting devices 110 formed on the wafer 101 are not illustrated. Referring to FIG. 3A, the wafer 101 is attached on a carrier film 120 and then the carrier film 120 is disposed on a vacuum table 130. Then, a printing mask 140 is disposed above the wafer 101.

Figure 4:
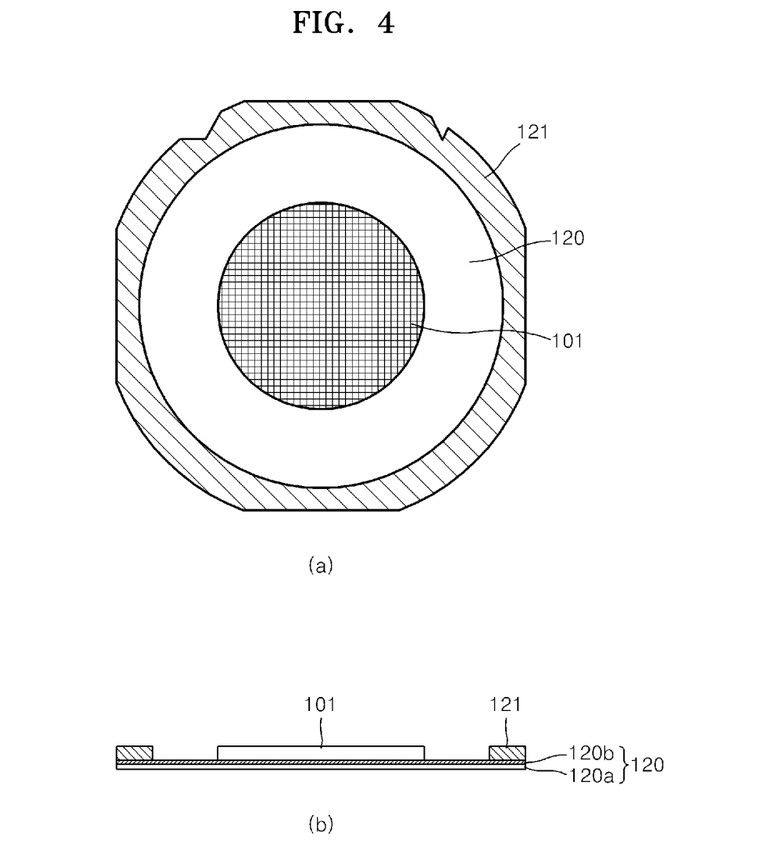
FIGS. 4A and 4B respectively are a plan view and a cross-sectional view schematically illustrating a carrier film and a wafer disposed on the carrier film illustrated in FIGS. 3A through 3D.

In general, when the wafer 101 is thinned by the thinning process, the wafer 101 may be warped during the forming of the phosphor layer. In order to prevent warpage, the phosphor layer is formed while the wafer 101 is attached on the carrier film 120 according to an embodiment of the present invention. Then, since the carrier film 120 holds the wafer 101, the wafer 101 is hardly warped. FIGS. 4A and 4B respectively are a plan view and a cross-sectional view schematically illustrating the carrier film 120 and the wafer 101 disposed on the carrier film 120. Referring to FIG. 4A, the wafer 101 is attached at the center of the carrier film 120 and a carrier frame 121 is installed along a circumference of the carrier film 120. As will be described later, the carrier frame 121 tightly fixes the carrier film 120 on the vacuum table 130 during the forming of a phosphor so that the carrier film 120 may not be moved or modified. In FIG. 4A, the carrier frame 121 in a ring-form is illustrated; however, the form of the carrier frame 121 is not limited thereto. For example, the carrier frame 121 may be disposed at both edges of the carrier film 120 in the form of a straight-line bar or an arc.

Referring to FIG. 4B, the carrier film 120 may include a base film 120a and a cohesive layer 120b formed on the base film 120a. The base film 120a may have heat resistance so as to endure the forming process of the phosphor layer by heating and hardening phosphor paste. Also, the base film 120a may have flexibility and UV permeability. The cohesive layer 120b is formed to secure location stability of the wafer 101 arranged on the carrier film 120. For example, the cohesive layer 120b may include a photosensitive adhesive (PSA) that may be hardened by UV light. When the cohesive layer 120b includes the PSA, UV light penetrates through the base film 120a after completing forming of the phosphor layer and the cohesive layer 120b is hardened. Then, the wafer 101 may be easily separated from the cohesive layer 120b.

FIGS. 5A and 5B are plan views schematically illustrating a structure of the printing mask 140 of FIGS. 3A through 3D. For example, the printing mask 140 may be a stencil mask including a masking member formed on a mesh structure including steel use stainless (SUS) to partially cover the mesh structure. Referring to FIG. 5A, the printing mask 140 may include a mask frame 141 formed around the circumference of the printing mask 140 to support the printing mask 140, a first masking member 143 formed to cover a region other than the wafer 101, and a printing region 142, on which the first masking member 143 is not formed. The printing region 142 may be formed to correspond to the wafer 101. That is, the size and form of the printing region 142 may be the same as those of the wafer 101. In FIG. 5A, SUS having the mesh structure is viewed in the printing region 142. FIG. 5B is an enlarged view of the printing region 142. Referring to FIG. 5B, a plurality of openings 144 having the same pattern as that of the plurality of semiconductor light-emitting devices 110 are formed in the printing region 142. Also, a second masking member 145 is formed to correspond to the scribe line 114 formed between the semiconductor light-emitting devices 110, and third masking members 146 are formed to correspond to the electrode pads 112 and 113 of the semiconductor light-emitting devices 110. The first, second, and third masking members 143, 145, and 146 may be formed of, for example, polymer or a metal thin film.

Referring to FIG. 3B, a vacuum is applied to the vacuum table 130 so that the carrier film 120 is closely adhered and fixed to the vacuum table 130 by vacuum suction pressure. As illustrated in FIG. 3B, the vacuum table 130 may have a stepped structure in which a center portion thereof protrudes upward and thus is higher than peripheral portions. Then, the carrier frame 121 formed at the circumference of the carrier film 120 is closely adhered to the peripheral portions of the vacuum table 130, and the wafer 101 disposed on the carrier film 120 may be closely adhered and fixed to the center portion of the vacuum table 130. In this regard, a diameter of the center portion of the vacuum table 130 that protrudes may be smaller than the inner diameter of the carrier frame 121. Due to the stepped structure of the vacuum table 130, the upper surface of the wafer 101 may be higher than the upper surface of the carrier frame 121. In this regard, a height of the center portion of the vacuum table 130 may be higher than a height of the carrier frame 121. Then, the printing mask 140 may contact the wafer 101 without obstruction by the carrier frame 121. Referring back to FIG. 3B, the vacuum table 130, on which the carrier film 120 is closely adhered and fixed, rises so that the printing mask 140 contacts the wafer 101. Here, the printing region 142 in the printing mask 140 is arranged to match with the wafer 101.

When the printing mask 140 is dispersed on the wafer 101, a phosphor paste 160 is provided on the printing mask 140, as illustrated in FIG. 3C. Then, the phosphor paste 160 is pushed and pressurized by using a squeegee 135. While the phosphor paste 160 exits through the printing region 142 of the printing mask 140, the phosphor paste 160 is uniformly coated on the wafer 101. The squeegee 136 may be formed of a plastic material so as to prevent metal particles from generating due to friction with the first, second, and third masking members 143, 145, and 146. For example, the squeegee 135 may be formed of an engineering plastic having excellent abrasion resistance and mechanical properties such as nylon, in addition to, urethane, acryl, and polycarbonate.

The phosphor paste 160 may be a mixture of a single type or a plurality of types of phosphor and a binder resin mixed according to a predetermined mixture ratio. The type and mixture ratio of the used phosphor may be selected according to desired emission characteristics. The binder resin may be formed of a material having excellent heat resistance and light transmittance and high photorefractive index. For example, epoxy- or silicon-based curable resin may be used. Such a curable resin may have a shore A hardness of 50 or above after hardening. Also, the curable resin may be mainly formed of a thermosetting resin material, wherein the thermosetting resin material may partially include UV curable material.

When the phosphor paste 160 is uniformly coated on the wafer 101, the vacuum table 130 drops downward, as illustrated in FIG. 3D, and the wafer 101 is removed from the printing mask 140. Then, the phosphor paste 160 is heated and hardened so that a phosphor layer 150 may be formed on the wafer 101. Also, the phosphor paste 160 is firstly hardened and the phosphor layer 150 is formed and then the vacuum table 130 drops downward so that the wafer 101 may be removed from the printing mask 140.

When forming of the phosphor layer 150 is completed, the wafer 101 formed on the carrier film 120 may be separated from the carrier film 120. When the cohesive layer 120b is formed of a PSA that may be hardened by UV light, UV light may be irradiated from the lower side of the carrier film 120 before removing of the wafer 101 and the cohesive layer 120b may be hardened. Then, the cohesive layer 120b is hardened and the wafer 101 may be easily removed. In the subsequent process, the plurality of semiconductor light-emitting devices 110 formed on the wafer 101 are each separated by dicing and the separate light emitting devices 110 are packaged, thereby manufacturing a white light-emitting device package. At this point, the characteristics of white light emitted through the phosphor layer 150 are examined and then the semiconductor light-emitting devices 110 having desired emission characteristics may be packaged. Then, white light-emitting device packages having uniform emission characteristics may be provided.

Figure 5:
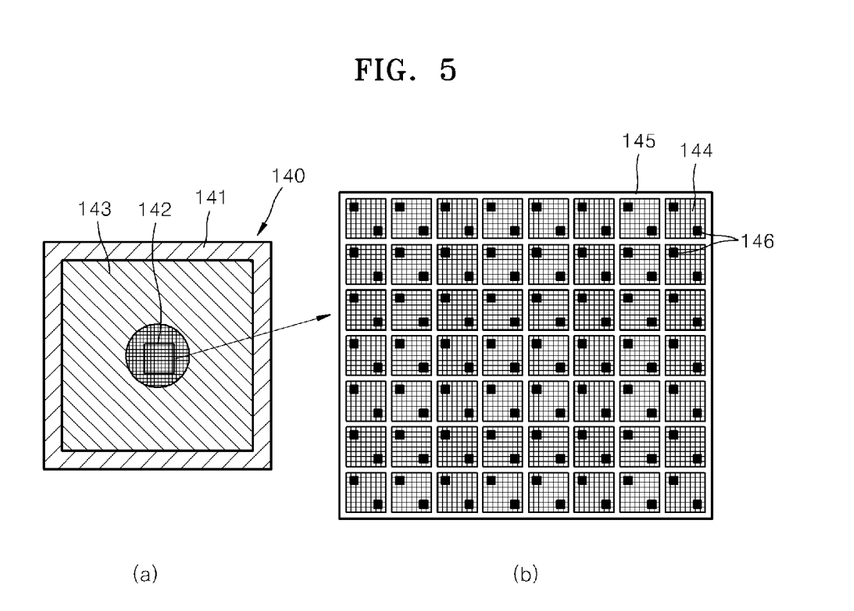
FIGS. 5A and 5B are plan views schematically illustrating a structure of a printing mask of FIGS. 3A through 3D.
Figure 6:
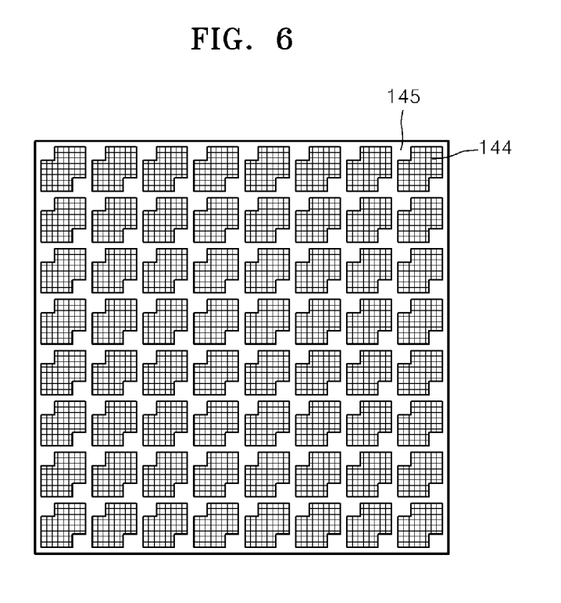
FIGS. 6 through 8 illustrate various examples of a printing mask.

The form of the printing region 142 illustrated in FIG. 5 may vary. For example, in FIG. 6, the second masking member 145 and the third masking members 146 are not separated from each other and only one second masking member 145 is formed in the printing region 142. In FIG. 5, the second masking member 145 that corresponds to the scribe line 114 formed between the semiconductor light-emitting devices 110 is separated from the third masking members 146 that correspond to the electrode pads 112 and 113 formed on the semiconductor light-emitting devices 110. However, in FIG. 6, the second masking member 145 is extended to regions corresponding to the electrode pads 112 and 113 of the semiconductor light-emitting devices 110 through edge portions of the openings 144. In this case, the electrode pads 112 and 113 of the semiconductor light-emitting devices 110 are easily covered and thus the phosphor paste 160 may be prevented from being coated partially on the electrode pads 112 and 113.

Figure 7:
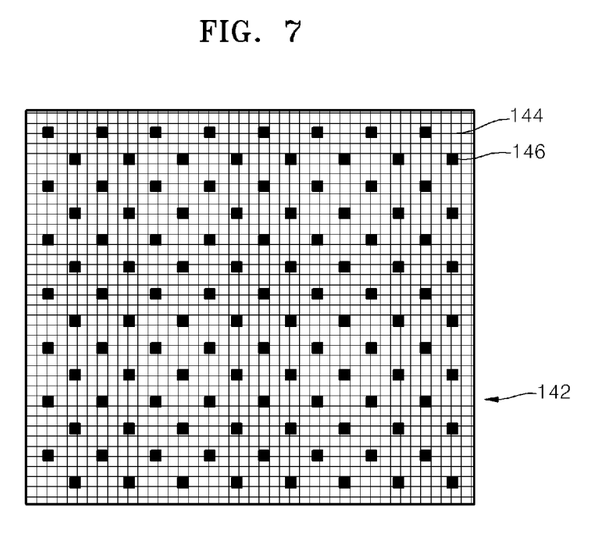

In FIG. 7, the third masking members 146 that correspond to the electrode pads 112 and 113 are formed only, i.e., without the second masking member 145 that corresponds to the scribe line 114. Also, in FIG. 7, the plurality of openings 144 that correspond to the semiconductor light-emitting devices 110 are not formed in the printing region 142 and instead, the entire printing region 142 is formed as one opening 144. In this case, the phosphor paste 160 may be coated in the scribe line 114 formed between the semiconductor light-emitting devices 110. Then, the phosphor layer 150 may be formed not only on the upper surfaces of the semiconductor light-emitting devices 110 but also sides of the semiconductor light-emitting devices 110. When light is partially emitted through the sides of the semiconductor light-emitting devices 110, the printing mask 140 illustrated in FIG. 7 is used to form the phosphor layer 150 at the sides of the semiconductor light-emitting devices 110.

Figure 8:
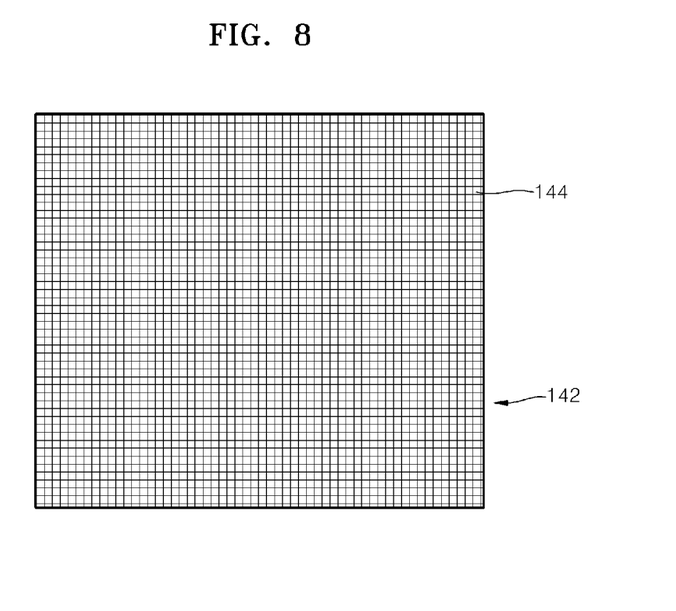
Figure 9:
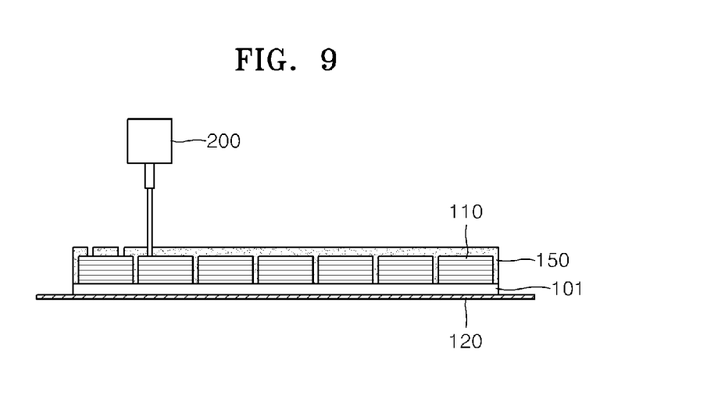
FIG. 9 schematically illustrates removing of a phosphor formed on an electrode pad of a light emitting device by irradiating laser.

Also, in FIG. 8, masking members are not formed in the printing region 142, and the entire printing region 142 is formed as one opening 144. In this case, it is not required to arrange the printing mask 140 to match with the pattern of the semiconductor light-emitting devices 110 when coating of the phosphor paste 160. Also, in this case, the phosphor paste 160 may be coated not only in the scribe line 114 formed between the semiconductor light-emitting devices 110 but also on the upper surfaces of the semiconductor light-emitting devices 110. Accordingly, the phosphor layer 150 may be formed at the sides and on the upper surfaces of the semiconductor light-emitting devices 110. That is, since the phosphor layer 150 is formed on the electrode pads 112 and 113 of the semiconductor light-emitting devices 110, the phosphor layer 150 formed on the electrode pads 112 and 113 may need to be removed after completing forming of the phosphor layer 150. The phosphor layer 150 may be removed by irradiating laser 200 on the locations of the electrode pads 112 and 113, as illustrated in FIG. 9. In this regard, the laser 200, which emits light in a wavelength band absorbed by the binder resin used in the phosphor paste 160, may be used. For example, in a silicon resin binder that is widely used, $CO_2$ laser having a long wavelength, which may be well absorbed by the silicon resin, may be used. As described above, when laser light is irradiated on the electrode pads 112 and 113, the phosphor layer 150 formed on the electrode pads 112 and 113 is removed and thus the electrode pads 112 and 113 may be exposed to the outside.

As described above, the phosphor layer 150 is firstly formed on the wafer 101, on which the semiconductor light-emitting devices 110 are formed, and then the semiconductor light-emitting devices 110 on the wafer 101 are each separated through dicing. However, the semiconductor light-emitting devices 110 on the wafer 101 may be firstly diced before forming the phosphor layer 150. For example, the wafer 101 is thinned and then the semiconductor light-emitting devices 110 on the wafer 101 are each separated through dicing. Then, the semiconductor light-emitting devices 110 are arranged on the carrier film 120 illustrated in FIG. 4. Here, the emission characteristics of the semiconductor light-emitting devices 110 are previously examined, and the semiconductor light-emitting devices 110 are classified according to the emission characteristics. Then, the semiconductor light-emitting devices 110 having the same emission characteristic may be arranged on the carrier film 120. Then, the carrier film 120, on which the separated semiconductor light-emitting devices 110 are arranged, is disposed on the vacuum table 130 by using the method described with respect to FIG. 3 and then the printing mask 140 is used to form the phosphor layer 150 on the separated semiconductor light-emitting devices 110 by using screen printing. That is, processes are the same as those described above except that dicing is performed prior to forming of the phosphor layer 150.

When forming of the phosphor layer 150 is completed, the cohesive layer 120b is hardened and then the semiconductor light-emitting devices 110 may be separately removed from the carrier film 120. Also, the carrier film 120 is directly cut so as to separate each semiconductor light-emitting device 110. Here, when the flexible base film 120a is used, the base film 120a is pulled and extended so that intervals between the semiconductor light-emitting devices 110 may increase. Then, since the intervals between the semiconductor light-emitting devices 110 may be sufficiently secured, the semiconductor light-emitting devices 110 may be easily removed from the carrier film 120 or the carrier film 120 may be easily cut. As such, when dicing is performed prior to forming of the phosphor layer 150, the phosphor layer 150 may be prevented from being damaged or contaminated due to minute particles generated during dicing.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An apparatus for manufacturing a light-emitting device, the apparatus comprising:
   a vacuum table comprising a center portion protruding upward and peripheral portions that are stepped to be lower than the center portion;
   a carrier film disposed on the vacuum table for attaching the wafer, on which a plurality of light-emitting devices are formed, on the carrier film; and
   a printing mask for uniformly coating a phosphor paste on the wafer,
   wherein the carrier film comprises a carrier frame formed along a circumference of the carrier film and a diameter of the protruding center portion of the vacuum table is smaller than an inner diameter of the carrier frame.

2. The apparatus of claim 1, wherein when applying a vacuum to the vacuum table, the carrier frame formed along the circumference of the carrier film is closely adhered and fixed to the peripheral portions of the vacuum table by vacuum suction pressure, and the wafer disposed on the carrier film is closely adhered and fixed to the center portion of the vacuum table.

3. The apparatus of claim 1, wherein a height of the center portion of the vacuum table is higher than a height of the carrier frame.

4. An apparatus for manufacturing a light-emitting device, the apparatus comprising:
   a vacuum table comprising a center portion protruding upward and peripheral portions that are stepped to be lower than the center portion;
   a carrier film disposed on the vacuum table for attaching the wafer, on which a plurality of light-emitting devices are formed, on the carrier film; and
   a printing mask for uniformly coating a phosphor paste on the wafer, wherein the printing mask comprises a mask frame formed around the circumference of the printing mask to support the printing mask, a first masking member formed to cover a region other than the wafer, and a printing region corresponding to the wafer.

5. The apparatus of claim 4, wherein the printing region comprises a plurality of openings having the same pattern as that of the plurality of light-emitting devices formed on the wafer, a second masking member formed to correspond to the scribe line formed between the light-emitting devices, and third masking members formed to correspond to electrode pads formed on the light-emitting devices.

6. The apparatus of claim 4, wherein the printing region comprises a plurality of openings having the same pattern as that of the plurality of light-emitting devices formed on the wafer and a second masking member formed to correspond to the scribe line formed between the light-emitting devices, the second masking member being extended to regions corresponding to the electrode pads formed on the light-emitting devices.

7. The apparatus of claim 4, wherein the printing region comprises one opening entirely formed in the printing region and third masking members formed to correspond to electrode pads formed on the light-emitting devices.

* * * * *